(12) United States Patent
Koizumi et al.

(10) Patent No.: US 7,639,305 B2
(45) Date of Patent: Dec. 29, 2009

(54) PHOTOELECTRIC CONVERSION DEVICE AND IMAGE PICKUP DEVICE

(75) Inventors: Toru Koizumi, Yokohama (JP); Hideaki Takada, Ebina (JP); Masanori Ogura, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 348 days.

(21) Appl. No.: 11/843,919

(22) Filed: Aug. 23, 2007

(65) Prior Publication Data

US 2008/0049130 A1 Feb. 28, 2008

(30) Foreign Application Priority Data

Aug. 28, 2006 (JP) ............................. 2006-231311

(51) Int. Cl.
H04N 5/225 (2006.01)
H04N 5/335 (2006.01)

(52) U.S. Cl. .................... 348/372; 348/298; 257/207

(58) Field of Classification Search ............. 348/372, 348/298; 257/207
See application file for complete search history.

(56) References Cited

U.S. PATENT DOCUMENTS

| | | | |
|---|---|---|---|
| 4,791,493 A | 12/1988 | Ogura et al. | 358/294 |
| 4,920,431 A | 4/1990 | Ogura et al. | 358/496 |
| 4,926,058 A | 5/1990 | Iwamoto et al. | 250/578.1 |
| 4,996,606 A | 2/1991 | Kawai et al. | 358/475 |
| 5,196,691 A | 3/1993 | Kitani et al. | 250/208.1 |
| 5,352,883 A | 10/1994 | Kitani et al. | 250/208.1 |
| 5,526,141 A | 6/1996 | Ogura et al. | 358/496 |
| 5,621,206 A | 4/1997 | Kitani et al. | 250/208.1 |
| 5,900,622 A | 5/1999 | Ogura et al. | 250/208.1 |
| 6,002,287 A | 12/1999 | Ueno et al. | 327/307 |
| 6,015,200 A | 1/2000 | Ogura | 347/3 |
| 6,479,845 B2 | 11/2002 | Chen | 257/211 |
| 6,567,571 B1 | 5/2003 | Kochi et al. | 382/312 |
| 6,587,603 B1 | 7/2003 | Sakurai et al. | 382/312 |
| 6,633,334 B1 | 10/2003 | Sakurai et al. | 348/308 |
| 6,650,369 B2 | 11/2003 | Koizumi et al. | 348/301 |
| 6,653,617 B2 | 11/2003 | Hiyama et al. | 250/214.1 |
| 6,757,016 B1 | 6/2004 | Ueno et al. | 348/279 |
| 6,831,685 B1 | 12/2004 | Ueno et al. | 348/243 |
| 6,839,084 B1 | 1/2005 | Hiyama et al. | 348/241 |
| 6,850,278 B1 | 2/2005 | Sakurai et al. | 348/302 |
| 6,932,499 B2 | 8/2005 | Ogura | 362/551 |
| 6,946,636 B2 | 9/2005 | Eguchi et al. | 250/208.1 |

(Continued)

FOREIGN PATENT DOCUMENTS

JP 2003-229557 8/2003

(Continued)

*Primary Examiner*—Sinh Tran
*Assistant Examiner*—Hung H Lam
(74) *Attorney, Agent, or Firm*—Fitzpatrick, Cella, Harper & Scinto

(57) ABSTRACT

A photoelectric conversion device includes a pixel array portion, signal processing portion, common readout circuit, and common signal line. The signal processing portion includes the first power line and the second power line which is formed on the opposite side to the first power line when viewed from the common signal line. The common signal line has a portion formed along the signal processing portion to transfer, to the common readout circuit, a signal supplied from the signal processing portion. A cross connection line which crosses the portion of the common signal line along the signal processing portion connects the first and second power lines.

7 Claims, 17 Drawing Sheets

U.S. PATENT DOCUMENTS

| | | | |
|---|---|---|---|
| 6,952,228 B2 | 10/2005 | Yoneda et al. | 348/308 |
| 6,960,817 B2 | 11/2005 | Ogura et al. | 257/448 |
| 6,963,372 B1 | 11/2005 | Hiyama et al. | 348/302 |
| 6,965,408 B2 | 11/2005 | Hiyama et al. | 348/308 |
| 7,015,964 B1 | 3/2006 | Koizumi et al. | 348/301 |
| 7,081,607 B1 | 7/2006 | Koizumi | 250/208.1 |
| 7,129,985 B1 | 10/2006 | Koizumi et al. | 348/372 |
| 7,142,233 B1 | 11/2006 | Ogawa et al. | 348/222.1 |
| 2002/0054390 A1 | 5/2002 | Koizumi et al. | 358/513 |
| 2002/0071035 A1* | 6/2002 | Sobol | 348/207 |
| 2003/0117510 A1 | 6/2003 | Sakurai et al. | 348/308 |
| 2004/0056355 A1 | 3/2004 | Minami et al. | 257/758 |
| 2004/0135175 A1 | 7/2004 | Kurokawa | 257/207 |
| 2004/0189846 A1 | 9/2004 | Hiyama et al. | 348/308 |
| 2005/0052554 A1 | 3/2005 | Sakurai et al. | 348/301 |
| 2005/0168605 A1 | 8/2005 | Hiyama et al. | 348/301 |
| 2005/0269610 A1 | 12/2005 | Hiyama et al. | 257/292 |
| 2005/0270395 A1 | 12/2005 | Yoneda et al. | 348/308 |
| 2006/0066741 A1 | 3/2006 | Koizumi et al. | 348/308 |
| 2006/0273350 A1* | 12/2006 | Nakamura | 257/207 |
| 2007/0001196 A1* | 1/2007 | Nonaka | 257/207 |
| 2007/0013796 A1 | 1/2007 | Ueno et al. | 348/272 |
| 2007/0138511 A1* | 6/2007 | Oates et al. | 257/208 |
| 2007/0241779 A1* | 10/2007 | Ogata | 326/38 |
| 2008/0049130 A1 | 2/2008 | Koizumi et al. | 348/298 |
| 2009/0020784 A1* | 1/2009 | Araki et al. | 257/207 |
| 2009/0102955 A1* | 4/2009 | Hiyama et al. | 348/301 |

FOREIGN PATENT DOCUMENTS

| | | |
|---|---|---|
| JP | 2004-61631 | 2/2004 |
| JP | 2004-111796 | 4/2004 |
| JP | 2004-221559 | 8/2004 |

* cited by examiner

PHOTOELECTRIC CONVERSION DEVICE AND IMAGE PICKUP DEVICE

BACKGROUND OF THE INVENTION

1. Field of the Invention

The present invention relates to a photoelectric conversion device and an image pickup device.

2. Description of the Related Art

Japanese Patent Laid-Open No. 2003-229557 describes an image sensor in which pixels are two-dimensionally arrayed. In the block diagram of FIG. 10, a plurality of pixels share an amplifier/noise processing circuit (signal processing portion) 14. FIG. 11 shows the concrete circuit arrangement of the signal processing portion described in Japanese Patent Laid-Open No. 2003-229557.

Generally, blocks for reading out a signal from a signal processing portion to a common signal line while a horizontal scanning circuit selects (scans) columns are sequentially arranged in the order of the signal processing portion, the common signal line, and the horizontal scanning circuit. With this arrangement, signals can be read out from pixels via a short path without the intervention of the horizontal scanning circuit.

In the arrangement described in Japanese Patent Laid-Open No. 2003-229557, the signal processing portion, e.g., amplifiers 14$d$ and 14$e$ shown in FIG. 11 needs to receive power. According to examinations of the present inventors, the following problems are found in the arrangement of power lines for supplying power.

First, as the resistance of the power line for the signal processing portion increases, the output from an OB (Optical Black=black reference pixel) fluctuates in accordance with horizontal shading and the optical signal of an effective pixel, thus posing a problem. Assume that a current of 10 µA per column flows in order to operate the signal processing portion. In this case, a solid-state image sensor with a resolution of 10 million pixels requires a signal processing circuit with about 4,000 columns. Although the signal processing circuit is horizontally divided, one of the signal processing circuits has 2,000 columns, and a current of 20 mA flows in total. Because of a voltage drop caused by the current, the voltage of the power supply shifts by several hundred mV in accordance with the position in the horizontal direction. As a result, horizontal shading is generated.

Second, a problem occurs when turning off an unused signal processing circuit in order to suppress power consumption. In this case, when the signal processing circuit switches from an OFF state to an ON state, it requires a period of time proportional to the product of the resistance of the power line and the sum of the substrate capacitance and power capacitance of the signal processing circuit, until the circuit stabilizes.

Third, the charge/discharge of capacitance and the current flowing through the signal processing circuit fluctuate in accordance with the output from each row. As described above, it takes a period of time until the fluctuation stabilizes, and high-speed reading cannot be performed, thus posing a problem. More specifically, in accordance with the output from the signal processing circuit, a current consumed by the signal processing circuit in a DC manner fluctuates by, e.g., about 1% with channel-length modulation of a MOS transistor used in the signal processing circuit. When a current flowing through the signal processing circuit is 20 mA, 1% of this current is 0.2 mA. When this current is voltage-converted by a resistor of 10Ω, a voltage of 2 mV is obtained. That is, the black reference fluctuates as much as 2 mV in accordance with the output, thus posing a large problem. Because of these problems, an output image becomes similar to an image degraded in quality due to smear in a CCD. Note that, in principle, smear occurs in the longitudinal direction in the CCD, and in the lateral direction in an amplification type solid-state image sensor.

In order to simply reduce the resistance of the power line, a wiring layer for the power line may be newly formed. More specifically, the horizontal scanning circuit is wired on the first and second metal layers, and the third metal layer is only used for wiring the power line. In this case, the third metal layer can be formed above the horizontal scanning circuit. However, the parasitic capacitance of a common signal line becomes about twice if the third metal layer covers the common signal line. As a result, the performance largely degrades, e.g., the readout speed decreases, and the readout gain decreases to ½.

SUMMARY OF THE INVENTION

The present invention has been made to overcome the conventional drawbacks, and has as its object to provide a photoelectric conversion device which has a new power line structure which contributes to, e.g., improvement of an image quality or to an increase in readout speed.

An aspect of the present invention relates to a photoelectric conversion device. The photoelectric conversion device includes a pixel array portion in which a plurality of pixels are arrayed to form a plurality of columns, a signal processing portion which processes signals of the plurality of columns supplied from the pixel array portion, a common readout circuit, a common signal line which has a portion formed along the signal processing portion to transfer, to the common readout circuit, the signals of plurality of columns supplied from the signal processing portion, a first power line formed in the signal processing portion, a second power line formed on an opposite side to the first power line when viewed from the common signal line, and a cross connection line which crosses the portion of the common signal line along the signal processing portion, and connects the first power line and the second power line.

The present invention can provide a photoelectric conversion device which has a new power line structure which contributes to, e.g., improvement of an image quality or to an increase in readout speed.

Further features of the present invention will become apparent from the following description of exemplary embodiments with reference to the attached drawings.

DESCRIPTION OF THE EMBODIMENTS

Preferred embodiments of the present invention will now be described in accordance with the accompanying drawings.

Figure 1:
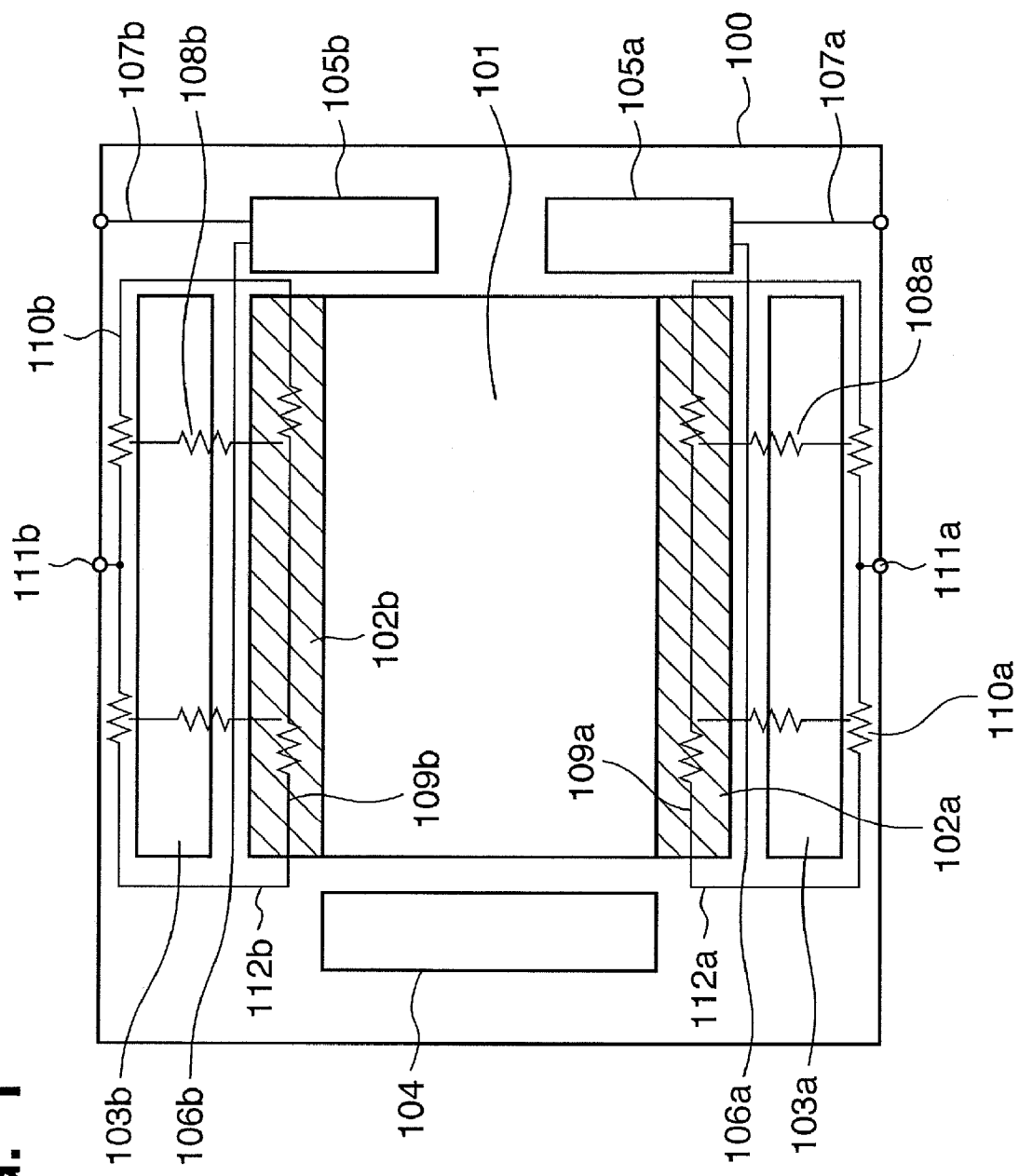
FIG. 1 is a block diagram schematically showing the arrangement of a photoelectric conversion device (solid-state image sensor) according to preferred embodiments of the present invention.
Figure 12:
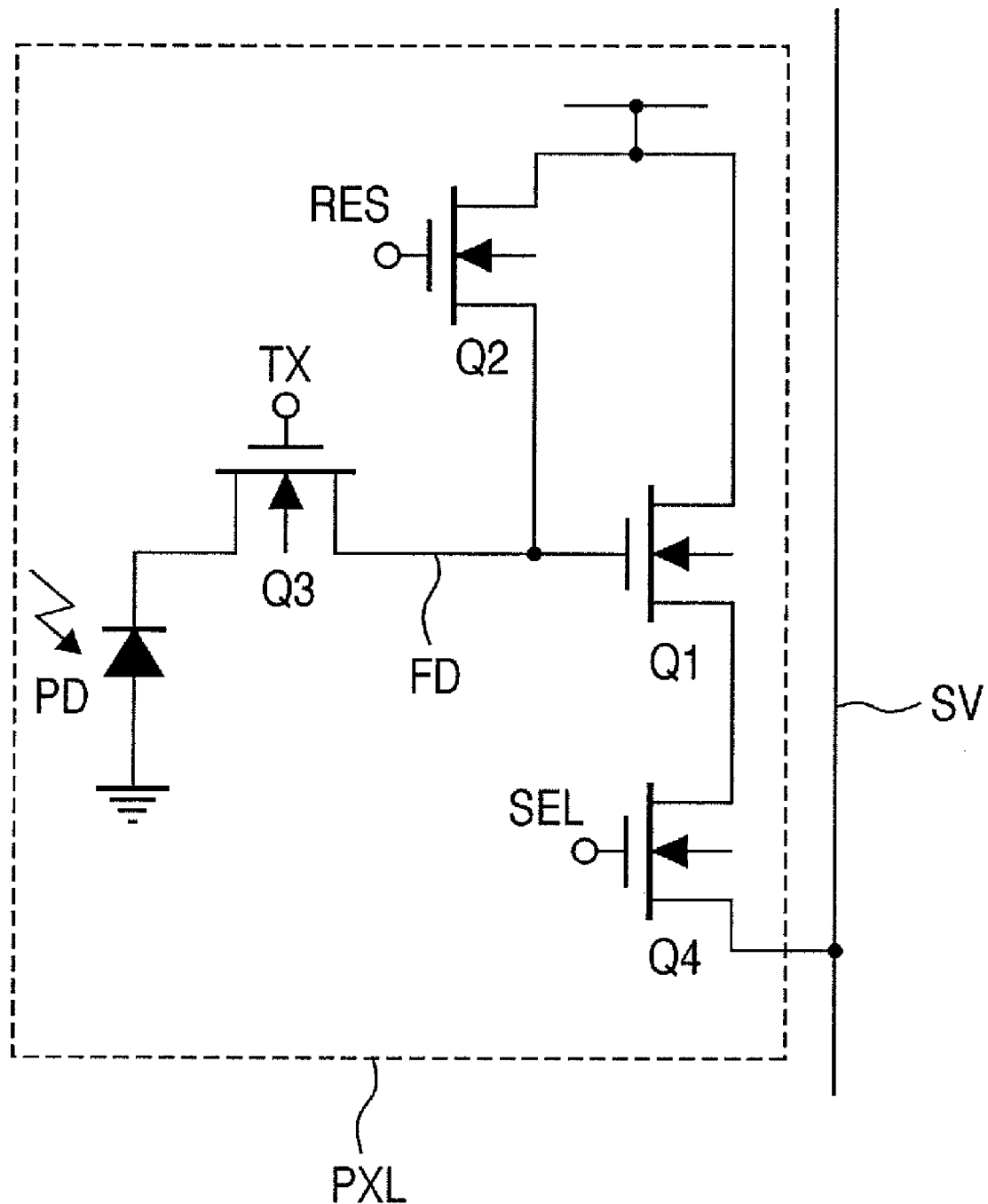
FIG. 12 is a circuit diagram showing an arrangement example of a pixel.

FIG. 1 is a block diagram schematically showing the arrangement of a photoelectric conversion device (solid-state image sensor) according to a preferred embodiment of the present invention. A pixel array portion 101 is an area in which a plurality of pixels are arrayed at least in a plurality of columns, typically, in a plurality of rows x a plurality of columns. FIG. 12 is a circuit diagram showing an arrangement example of a pixel PXL. A charge photoelectrically converted by a photodiode PD is transferred to a floating diffusion FD via a transfer switch Q3, and then output to a vertical signal line SV via an amplification transistor Q1. A row selection switch Q4 controlled by a vertical scanning circuit 104 selects a row to be read out.

A signal read out by a signal processing portion 102a or 102b via the vertical signal line SV is sequentially supplied to a common readout circuit 105a or 105b via a common signal line 106a or 106b by a horizontal scanning circuit 103a or 103b. The signal amplified by the common readout circuit 105a or 105b is output to an output line 107a or 107b.

Figure 15:
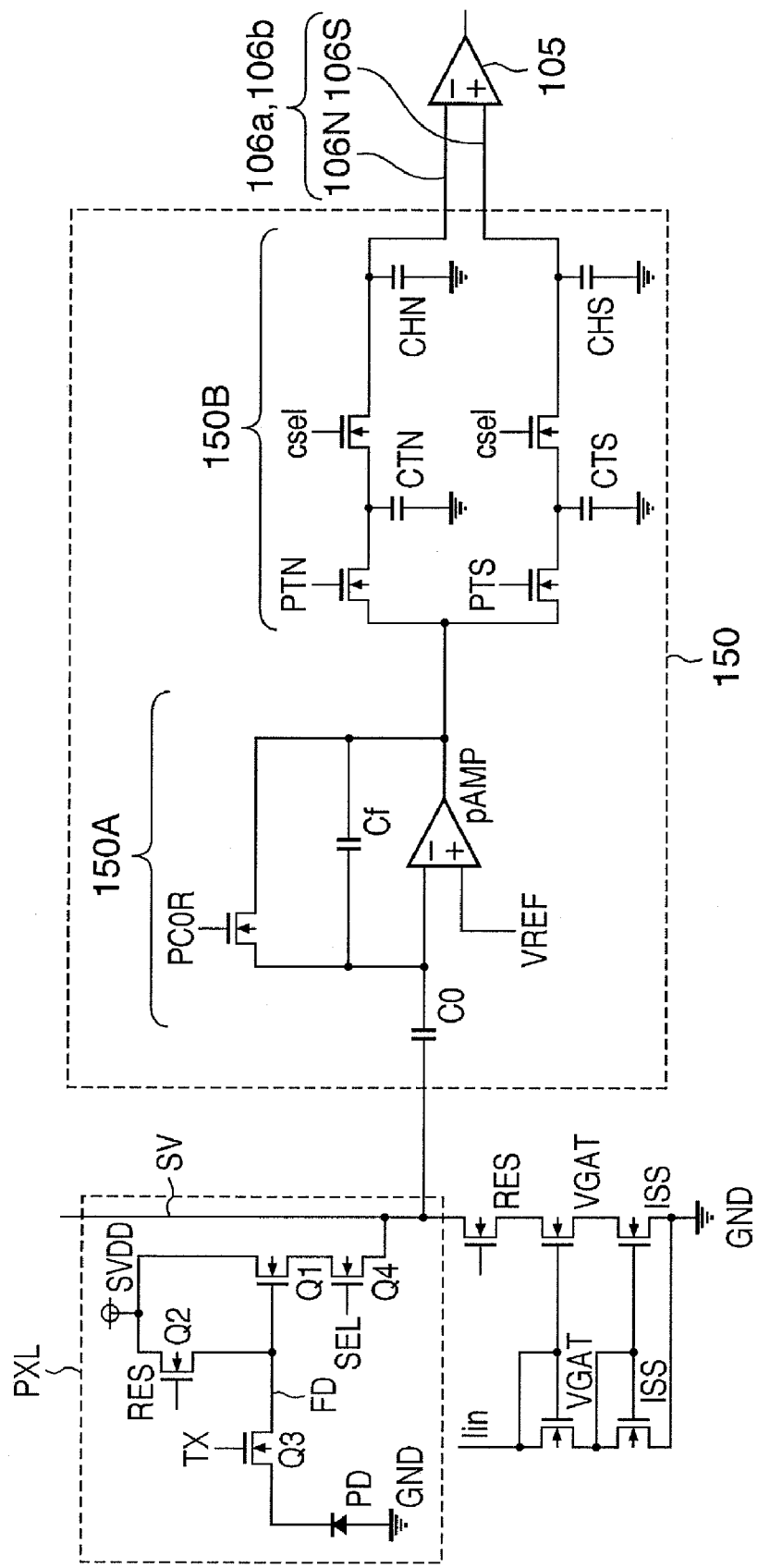
FIG. 15 is a circuit diagram showing an arrangement example of the signal processing portion.

FIG. 15 is a circuit diagram showing an arrangement example of one column of signal processing circuits 150 included in a signal processing portion 102, i.e., 102a or 102b. For example, the signal processing circuit 150 for each column can include an amplifier block 150A and a line memory block 150B. However, the signal processing circuit 150 may include only one of the amplifier block and the line memory block. The plurality of horizontally arrayed signal processing circuits 150 are sequentially connected to a common signal line 106, i.e., 106a or 106b by a horizontal scanning circuit 103, i.e., 103a or 103b to supply a noise level and an optical signal level to a common readout circuit 105, i.e., 105a or 105b. Note that the common signal line 106, i.e., 106a or 106b includes an N signal line 106N which transfers the noise level, and an S signal line 106S which transfers the optical signal level. The common signal line 106, i.e., 106a or 106b has a portion along the signal processing portion 102, i.e., 102a or 102b.

The signal processing portion 102, i.e., 102a or 102b can be formed between the common signal line 106, i.e., 106a or 106b and the pixel array portion 101. The horizontal scanning circuit 103, i.e., 103a or 103b can be formed on the opposite side to the signal processing portion 102, i.e., 102a or 102b when viewed from the common signal line 106, i.e., 106a or 106b. That is, the common signal line 106, i.e., 106a or 106b is formed between the signal processing portion 102, i.e., 102a or 102b and the horizontal scanning circuit 103, i.e., 103a or 103b.

A first power line 109, i.e., 109a or 109b is formed in the row direction (in a direction along a row, or in the horizontal direction) in the signal processing portion 102, i.e., 102a or 102b. A second power line 110, i.e., 110a or 110b is formed in the row direction on the opposite side to the signal processing portion 102, i.e., 102a or 102b when viewed from the common signal line 106, i.e., 106a or 106b. The first power line 109 is connected to the second power line 110 via a cross connection line 108, i.e., 108a or 108b which crosses the portion of the common signal line 106, i.e., 106a or 106b which is along the signal processing portion 102, i.e., 102a or 102b. The first power line 109 may also be connected to the second power line via a bypass line 112, i.e., 112a or 112b which is formed outside the signal processing portion 102, i.e., 102a or 102b. For example, the second power line 110, i.e., 110a or 110b is connected to a power pad 111, i.e., 111a or 111b near a center portion. In this case, the resistance value of the first power line 109, i.e., 109a or 109b is R1, and the resistance value of the second power line 110, i.e., 110a or 110b is R2.

Note that the term "power line" includes a plus-side power line and minus-side power line (ground line) in this specification.

Figure 17:
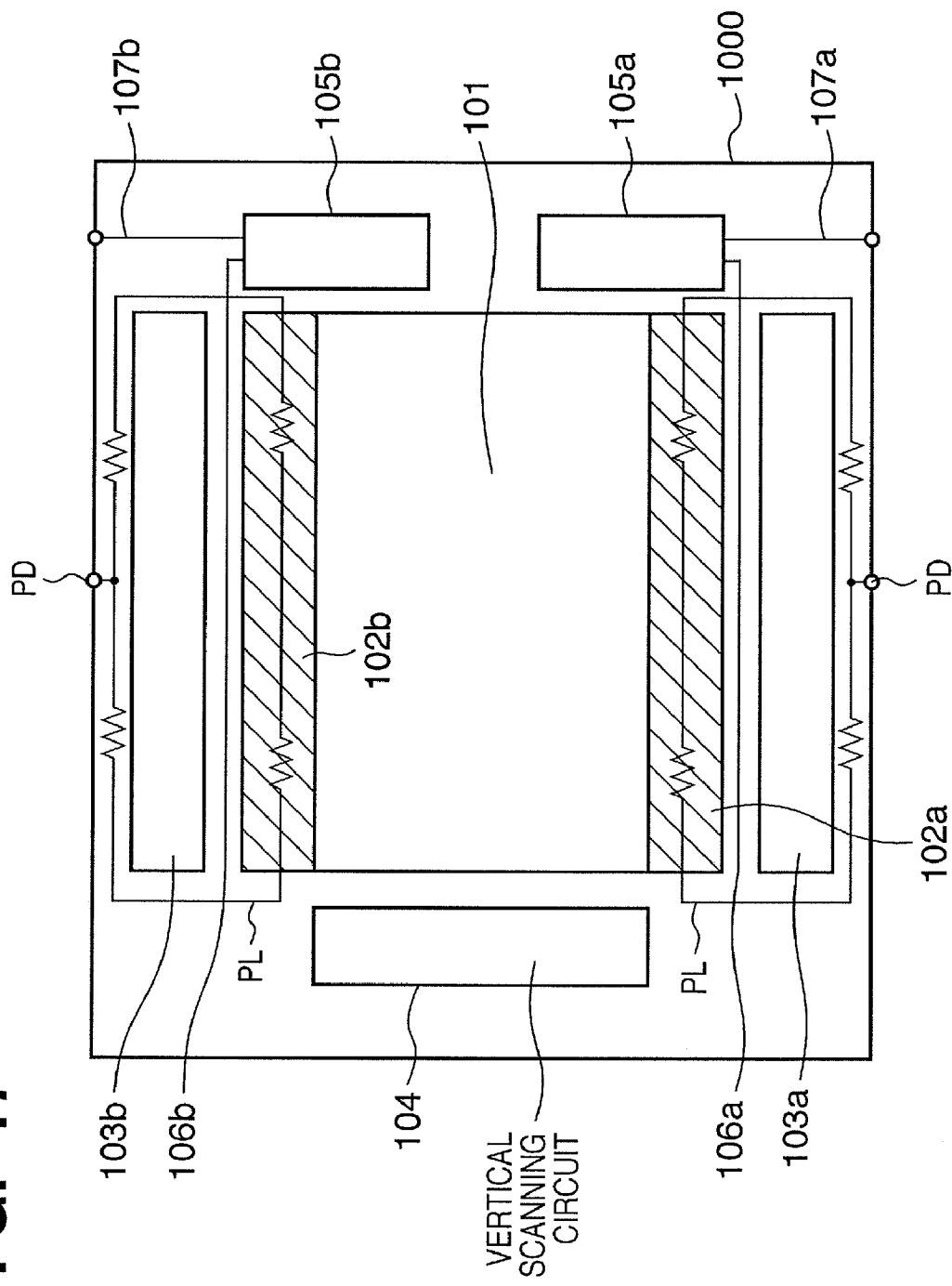
FIG. 17 is a block diagram showing a layout example of a power line.

With the arrangement of the power line shown in FIG. 17 as a comparison target, as the size of the photoelectric conversion device increases, the resistance of the power line increases. For example, a chip size similar to the window size in an Advanced Photo System is about 24 mm in the longitudinal direction. If the power line length is 24 mm and the power line width is 50 μm, the resistance value across the two ends of the power line is 20 to 30Ω.

Generally, a sufficient arrangement space is ensured outside the horizontal scanning circuit, and the resistance of the power line can be decreased. Since the width of the power line cannot be sufficiently ensured in the signal processing portion, the resistance value of the power line increases. That is, generally, R1>R2.

Figure 2:
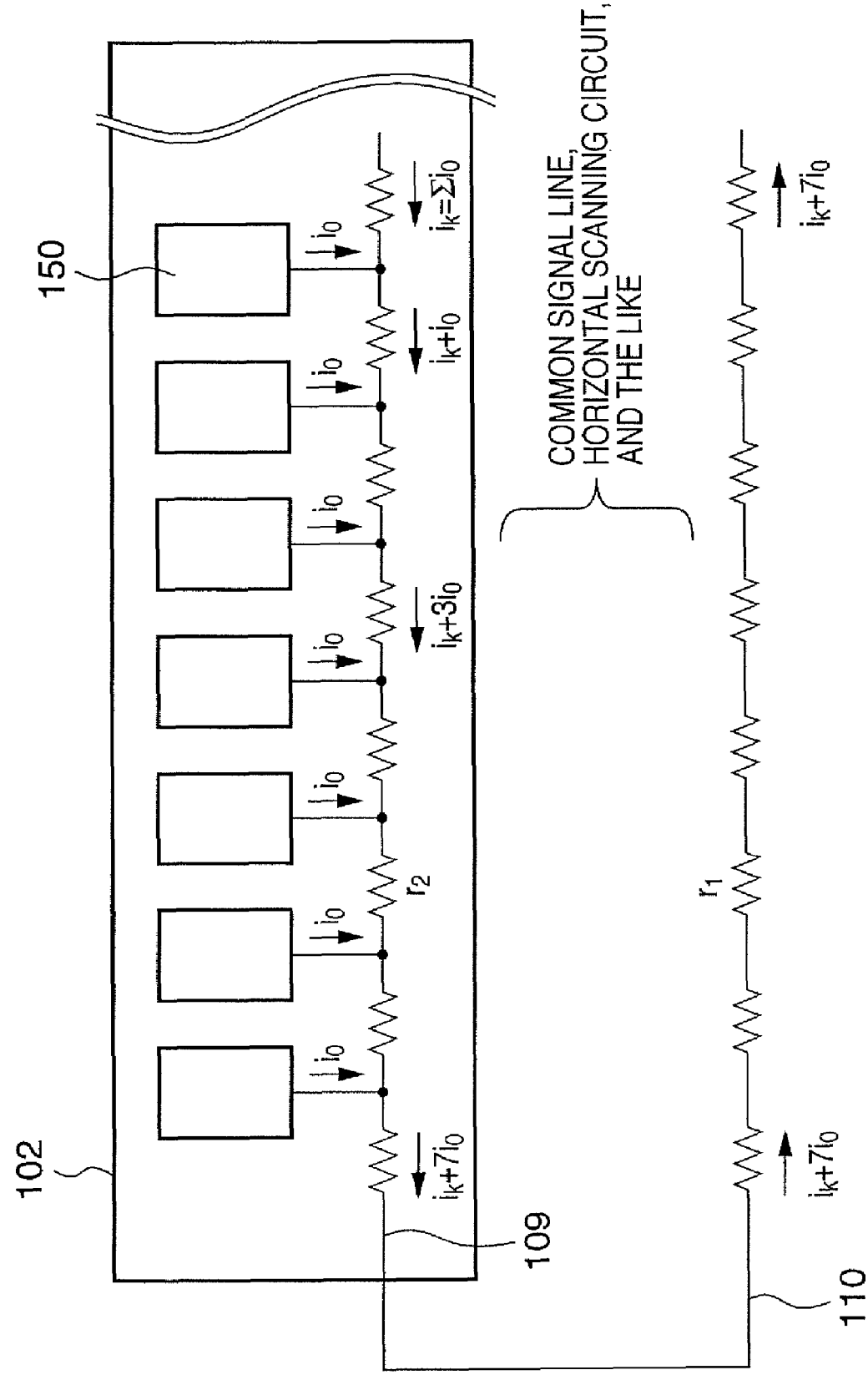
FIG. 2 is a block diagram for explaining a voltage drop on the first and second power lines when no cross connection line is present.

FIG. 2 is a block diagram for explaining a voltage drop on the first and second power lines. The plurality of signal processing circuits 150 are arrayed in the row direction in the signal processing portion 102, i.e., 102a or 102b. A current $i_0$ flows through the signal processing circuit 150 of one column. A voltage drop V of the kth column is given by $$V = R2 \times N/2 + r2 \times i_0 \times \{N/2 + (N/2-1) + (N/2-2) + (N/2-3) \ldots + (N/2-k)\}$$

where N is the number of columns in a photoelectric conversion device 100.

It should be noted that in the arrangement exemplified in FIG. 17 (when the first and second power lines are connected at two ends), a current flowing through the half of the columns is concentrated to the end portion of the signal processing device although a current flowing through each column is small. More specifically, the total sum of fluctuation currents at the center portion in the signal processing circuit is concentrated to the signal processing portion (peripheral portion) of the OB portion serving as a black reference.

Figure 3:
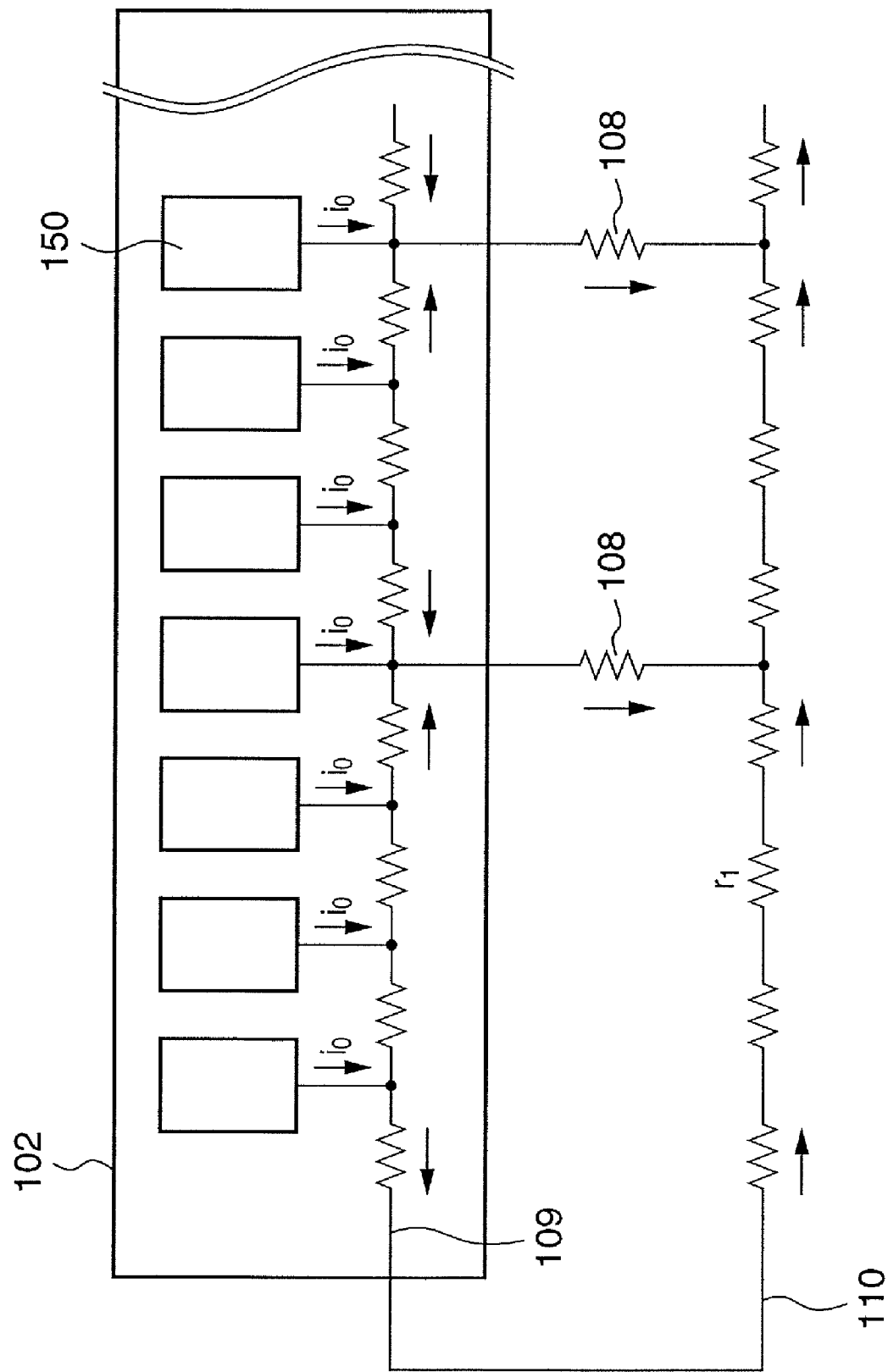
FIG. 3 is a block diagram showing the arrangement of power lines when cross connection lines are present according to the preferred embodiments of the present invention.

According to a preferred embodiment of the present invention, the first power line 109 is connected to the power signal line 110 via the cross connection line 108, i.e., 108a or 108b which crosses the portion of the common signal line 106, i.e., 106a or 106b which is along the signal processing portion 102. With this arrangement, current concentration in the arrangement exemplified in FIG. 17 can be prevented. FIG. 3 is a block diagram showing the arrangement of the power lines when the cross connection lines are present according to the preferred embodiment of the present invention.

For example, the cross connection lines 108 can be formed at intervals of several columns. The cross connection lines 108 can serve as metal lines each having a width of only several μm. The power lines connected in series as shown in FIG. 17 are connected in parallel via the cross connection lines, thereby reducing the resistance of the power lines. Furthermore, a large effect can be obtained if a first power line having a higher power line resistance is connected in parallel to a second power line having a lower power line resistance.

The plurality of cross connection lines 108 are preferably arrayed in the row direction regularly. Such arrangement matches well with a circuit arrangement in which basic units are repeatedly arrayed, thereby minimizing the influence on the design of the circuit arrangement. Since the cross connection lines 108 are separately arrayed, a current is not concentrated to the OB portion. Additionally, as the resistance of the power line decreases, the shading is also suppressed. Although the shading remains, the shape of the shading is moderate, and its appearance is not conspicuous on an image.

Note that an effect obtained when the cross connection lines 108 are formed between the first and second power lines will be estimated. Assume that metal lines each having a width of 3 μm are formed at intervals of 100 columns.

When metal lines each having a width of 3 μm are formed at intervals of 100 pixels, an arrangement space is sufficient. That is, the metal lines can be formed by reducing the pitch by about 0.03 μm for each pixel. The resistance value of each cross connection line is about 10Ω. When 4,000 columns of pixels are used, 40 cross connection lines are formed. Hence, the resistance value of each cross connection line can be decreased to several Ω, actually.

The cross connection line crosses the common signal line on the wiring layer different from the common signal line, thereby increasing the parasitic capacitance of the common signal line. However, the increment of the parasitic capacitance is small, e.g., about 1%.

Figure 4:
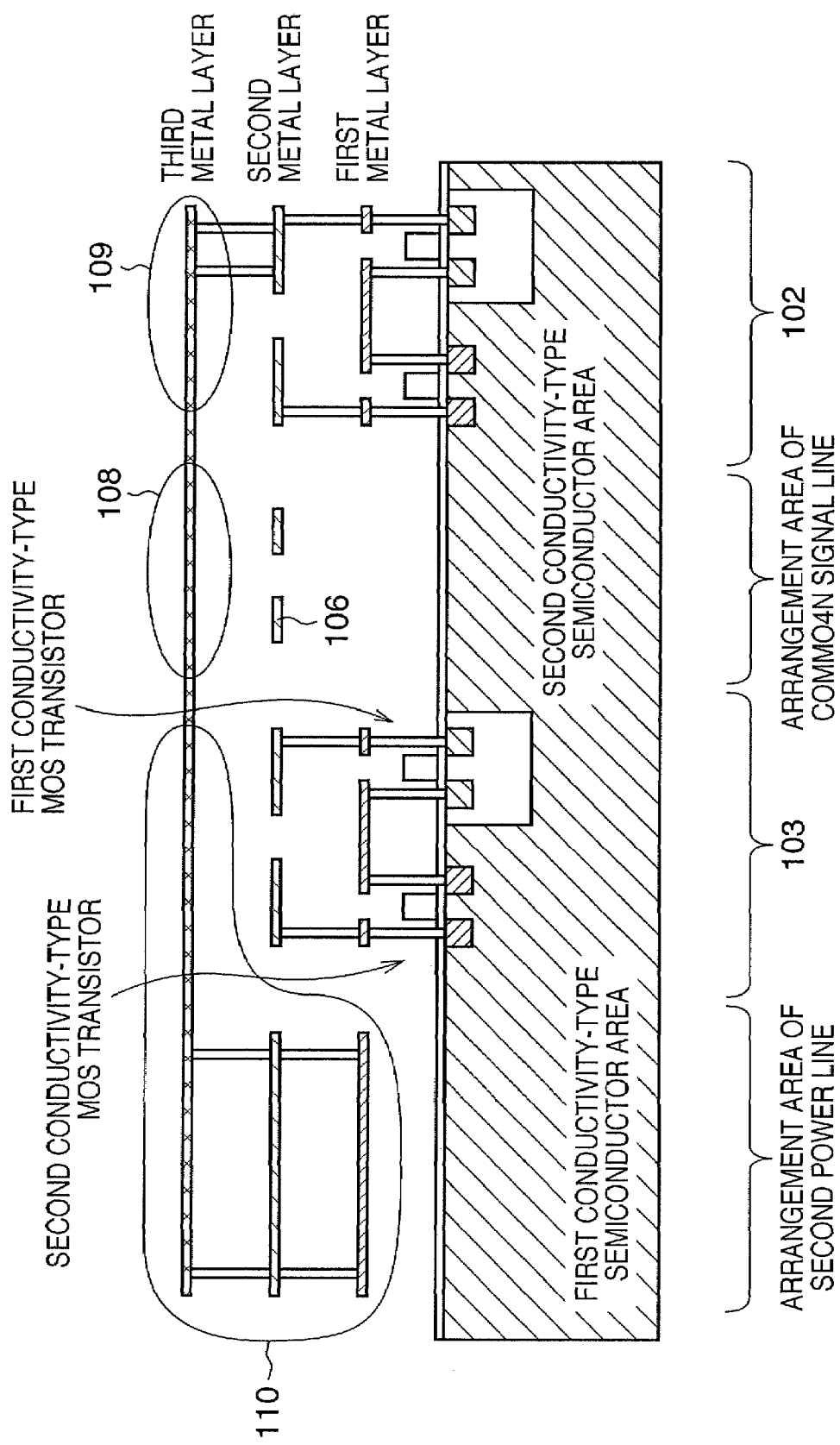
FIG. 4 is a schematic sectional view showing an example of a wiring structure according to the preferred embodiment of the present invention.

In order to achieve such arrangement, some methods are available. For example, the cross connection line 108 is formed on at least one of the first and second metal layers, on the assumption that the horizontal scanning circuit 103 or the signal processing portion 102 is wired on the first and second metal layers. A heavily doped impurity region in a polysilicon layer or a silicon layer may be partially used as needed. As exemplified in FIG. 4, the third metal layer may be added to the horizontal scanning circuit 103 or the signal processing portion 102 to form the cross connection line 108 on the third metal layer. When using the third metal layer, the second power line 110 is easily formed above almost the entire surface of the horizontal scanning circuit 103. In this case, a second power line having a lower resistance can be formed.

Figure 5:
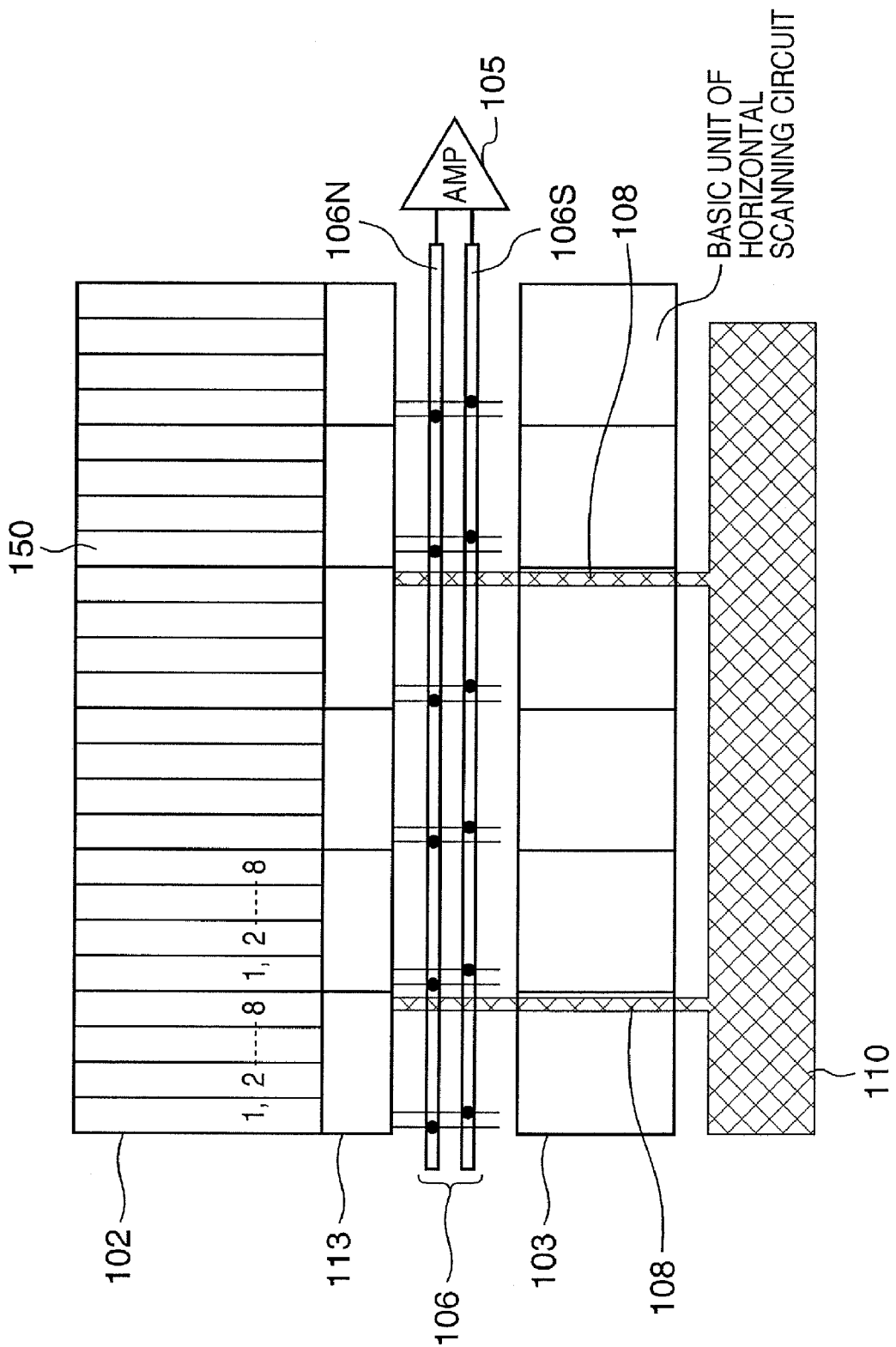
FIG. 5 is a layout view showing an example of a method of connecting the first and second power lines via cross connection lines.

FIG. 5 is a layout view showing an example of a method of connecting the first and second power lines 109 and 110 via cross connection lines. In the layout example shown in FIG. 5, each of the signal processing portion 102 and the horizontal scanning circuit 103 includes repeatedly-arranged basic units based on their characteristics. The cross connection lines 108 are efficiently formed every repeating cycle. Such arrangement prevents pattern noise.

The cross connection line 108 connects the first and second power lines 109 and 110 only by crossing a portion of the common signal line 106, thereby suppressing an increase in parasitic capacitance.

The cross connection lines 108 may be formed every cycle of the basic unit, or formed at intervals of several basic units. The cross connection lines 108 need not be cyclically formed, but may be formed in accordance with another rule such as geometric progression depending on the shape of the shading.

First Embodiment

As shown in FIG. 1, two cross connection lines 108 are formed to connect a set of a first power line 109a or 109b and a second signal line 110a or 110b. The cross connection lines 108 are formed to equally divide each of the first power line 109a or 109b and the second signal line 110a or 110b into three. As exemplified in FIG. 4, the second power line is also formed on the third metal layer in the area of a horizontal scanning circuit 103 to form the cross connection line 108 on the third metal layer. The width of the cross connection line 108 is set to 20 μm. Since the resistance of one cross connection line is about 1Ω, the resistance value of all the power lines decreases to ⅕ or less. The fluctuation amount of an OB decreases to about 1/10 because the path of a displacement current hardly passes through the OB.

Figure 6:
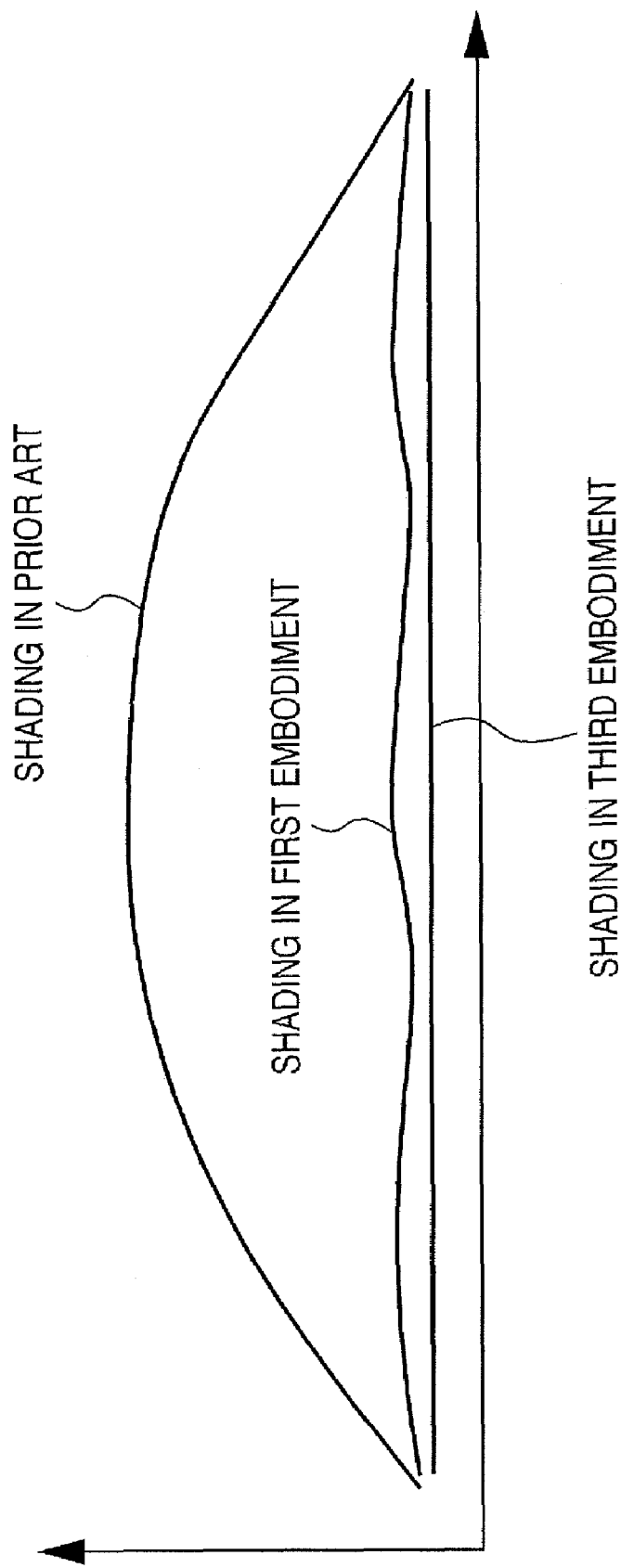
FIG. 6 is a graph for comparing shading characteristics.

FIG. 6 shows shading which occurs in a photoelectric conversion device according to the first embodiment.

Second Embodiment

Figure 7:
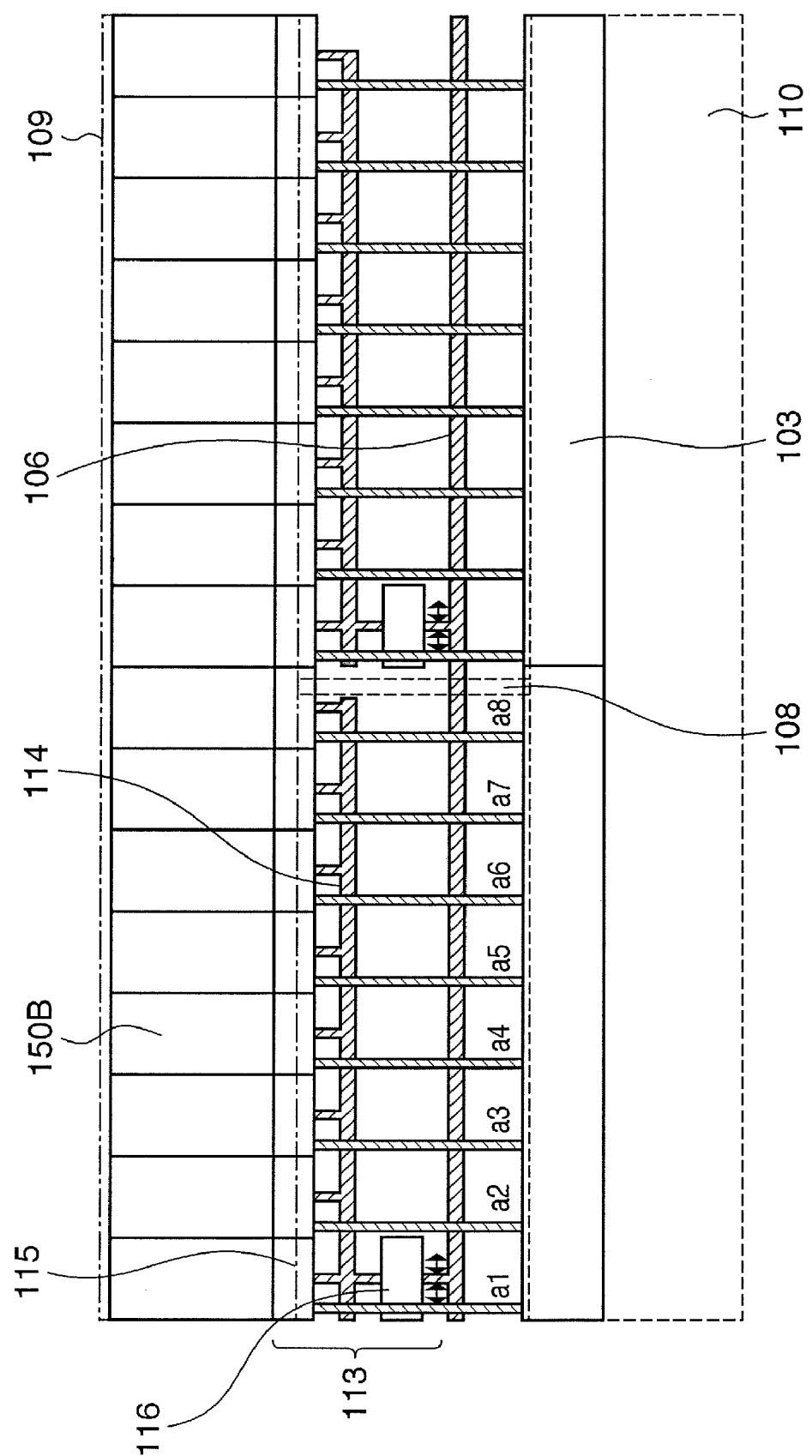
FIG. 7 is a layout view showing a preferred embodiment of the present invention.
Figure 13:
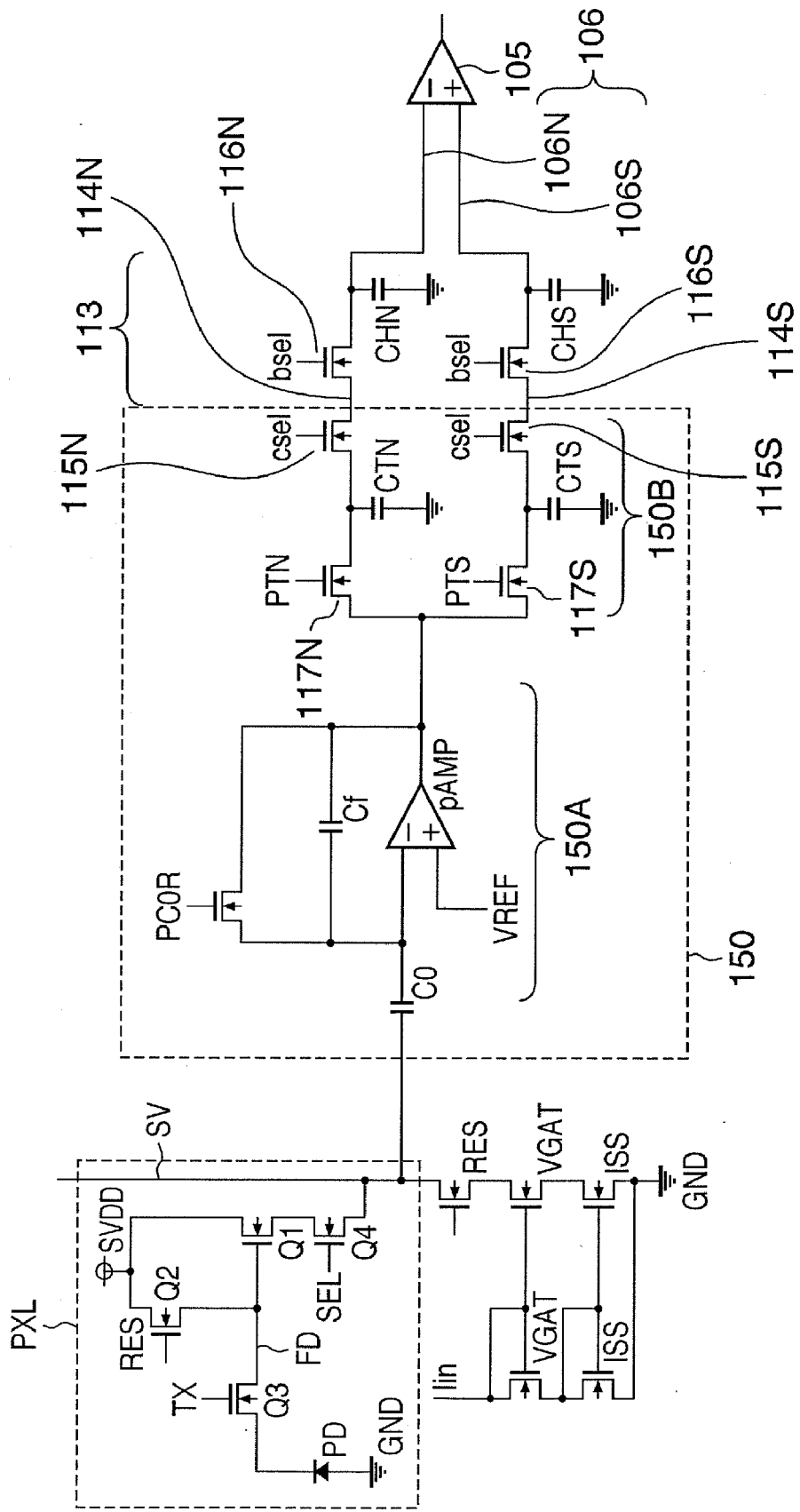
FIG. 13 is a circuit diagram showing an arrangement example of the signal processing portion.

FIGS. 5, 7, and 13 show schematic arrangements of a photoelectric conversion device according to the second embodiment. In a signal processing portion 102, a plurality of signal processing circuits 150 are arrayed in the row direction. In this embodiment, the signal processing portion 102 is divided into blocks each having eight signal processing circuits 150.

As exemplified by FIG. 13, each signal processing circuit 150 includes an amplifier block 150A having a differential amplifier, and a line memory block (CTS and CTN) 150B holding the output from the amplifier block 150A. The line memory block 150B includes a capacitor CTN holding a noise level (N signal), and a capacitor CTS holding a signal (S signal) on which the optical signal level and the noise level are superposed. The line memory block 150B also includes control switches 117N and 117S which respectively control write operations of the noise level and the optical signal level to the capacitors CTN and CTS in accordance with write control signals PTN and PTS.

A connection control portion 113 includes a first switch 115, i.e., 115N or 115S which transfers a signal from the capacitor CTN or CTS to a second common signal line 114, i.e., 114N or 114S in accordance with a column selection signal csel transferred from a horizontal scanning circuit 103. The eight signal processing circuits 150 as one block share the second common signal line 114, i.e., 114N or 114S. The connection control portion 113 also includes a second switch 116, i.e., 116N or 116S which connects the second common signal line 114, i.e., 114N or 114S to a first common signal line 106, i.e., 106N or 106S in accordance with a block selection signal bsel transferred from the horizontal scanning circuit 103.

A signal is read out from the signal processing circuit 150 to the common signal line 106, i.e., 106N or 106S via the first switch 115, the second common signal line 114, and the second switch 116. This scheme has an advantage that the number of switches connected to the first common signal line can be set smaller than that of columns. The number of switches connected to the first common signal line is reduced to ½ of that of columns by a scheme in which the signal processing portion is horizontally divided to read out a signal, and also reduced to 1/b upon dividing the signal processing circuits 150 into b blocks. Hence, the resultant number of switches is reduced to N/2b (e.g., upon dividing the signal processing circuits 150 into eight blocks, the number of switches is reduced to N/16).

When a cycle longer than the column cycle is generated in the circuit arrangement (more specifically, in the connection control portion 113) upon dividing the signal processing circuits 150 into blocks, cross connection lines 108 are preferably formed at positions corresponding to the cycle. In this embodiment, the cross connection line 108 was formed at the boundary portion between repeating units in the connection control portion 113 (connection portion). When the width of the cross connection line was 0.8 µm, the resistance of one cross connection line was about 5 Ωm. In the arrangement having 4,000 pixels in the horizontal direction (that is, 4,000 columns of pixels), the cross connection lines are formed every eight line memories on each of the upper and lower sides of a pixel array portion 101 (that is, every 16 columns of the pixel array portion 101). With this arrangement, 125 cross connection lines are formed on each of the upper and lower sides of the pixel array portion 101.

When the cross connection lines are formed in accordance with the cycle in the circuit arrangement as described above, cyclic pattern noise can be suppressed, and the cross connection lines can be efficiently formed in a space which can be formed in accordance with the cycle of the circuit arrangement.

In the first embodiment, the shading having characteristics is generated near the cross connection line. However, in the second embodiment, the cross connection lines were formed at 125 positions. Hence, the current was distributed, the distance between the cross connection lines decreased, and the shading almost disappeared. When increasing the number of cross connection lines, the resistance can be effectively kept low even when the resistance value of one cross connection line increases. Accordingly, the width of the cross connection line can be decreased, and discontinuity can be effectively suppressed. That is, the pattern noise decreases.

In this embodiment, the photoelectric conversion device having the S and N signal lines was tested. Of course, the effect of the present invention can be obtained in a simple readout circuit without any N signal line.

Furthermore, a photoelectric conversion device in which cross connection lines are formed in a cycle twice the above-described cycle, that is, in which one cross connection line is formed every two repeating units was also tested. In this case, the parasitic capacitance of the common signal line slightly decreased, but slight pattern noise was generated.

Third Embodiment

Figure 8:
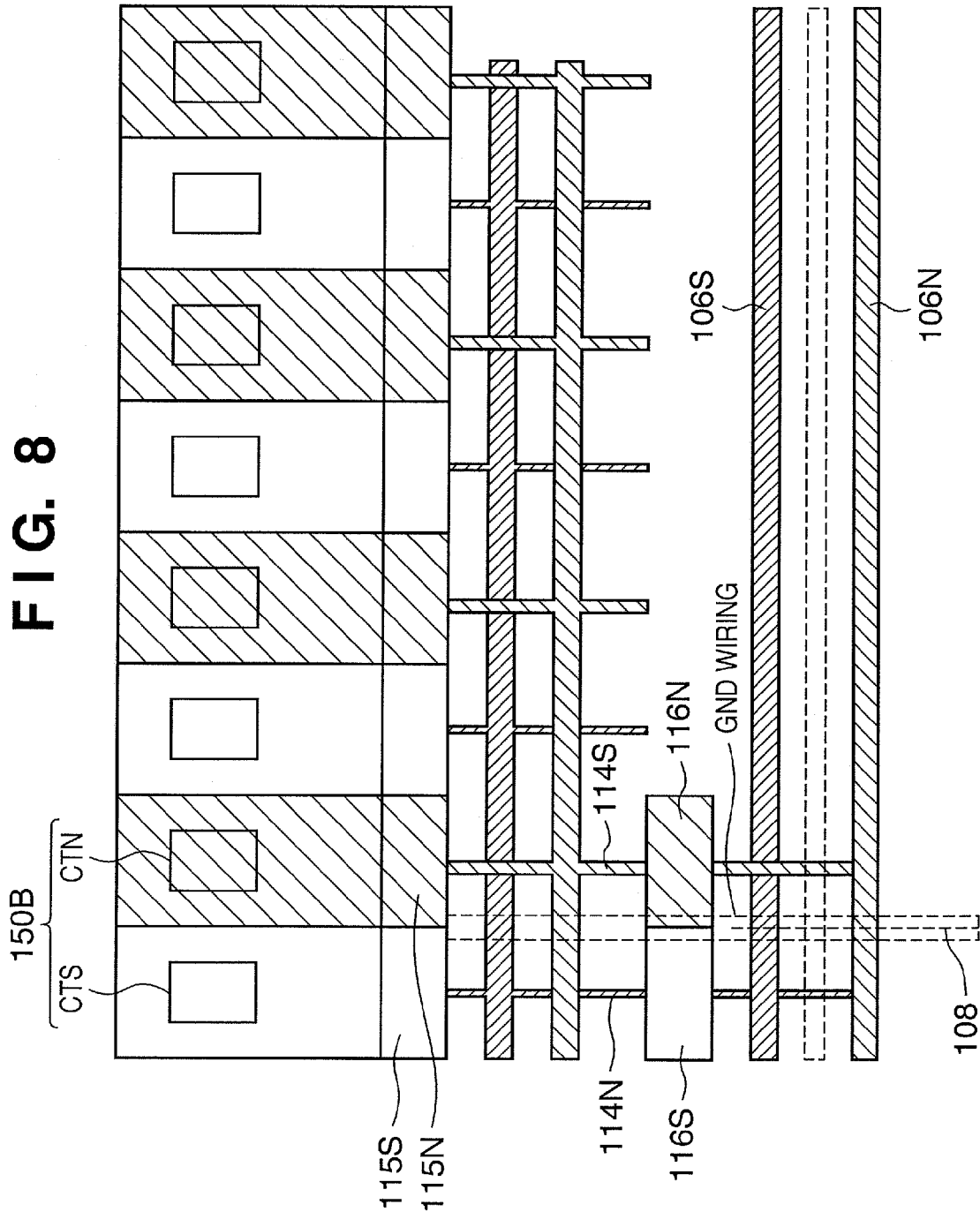
FIG. 8 is a layout view showing a preferred embodiment of the present invention.

FIG. 8 is a layout view showing the schematic arrangement of a photoelectric conversion device according to the third embodiment. Similar to the second embodiment, the photoelectric device of the third embodiment includes first and second common signal lines. In the third embodiment, a cross connection line is applied as the ground line of power lines. When an n-type differential amplifier serves as an amplifier block 150A, an important reference power line is a ground line. Capacitive coupling between N and S signal lines is not preferable. In order to prevent capacitive coupling between the S and N signal lines, a cross connection line 108 which forms part of the ground line is formed between a lead line (S lead line) of the S signal line 114S and a lead line (N lead line) of the N signal line 114N. That is, the cross connection line 108 is formed to reduce the resistance of the ground line, and to separate the S and N signal lines.

In this embodiment, S and N signal lines 106S and 106N are formed on the second metal layer, and the S and N lead lines 114S and 114N are formed on the first metal layer. With this arrangement, a preferable solid-state image sensor almost without shading and OB output fluctuation can be manufactured, in which the third metal layer for reducing the resistance is not formed above the common signal line, i.e., the parasitic capacitance does not increase. FIG. 6 shows the shading in the photoelectric conversion device according to the third embodiment.

Fourth Embodiment

Figure 9:
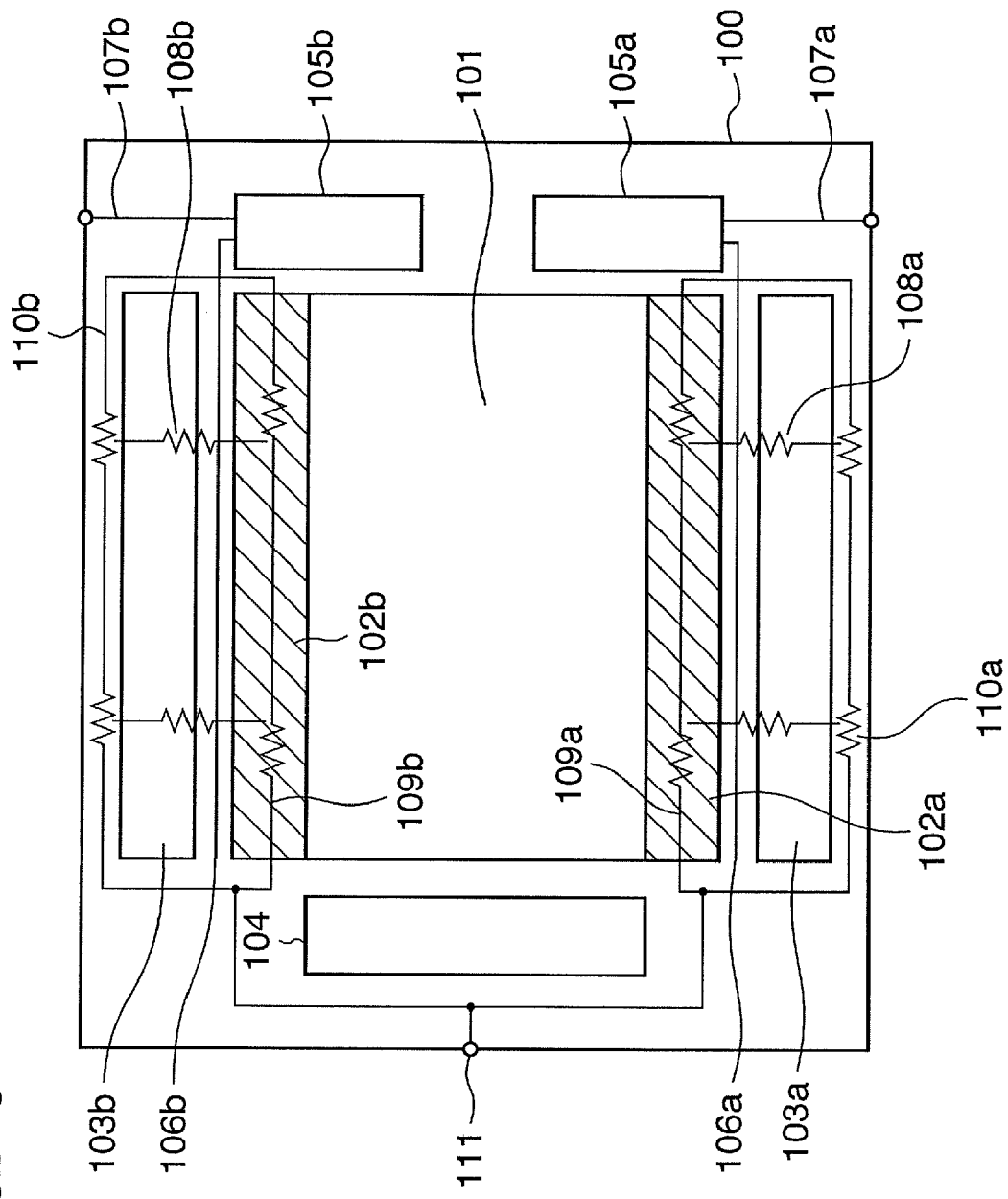
FIG. 9 is a block diagram showing a preferred embodiment of the present invention.
Figure 10:
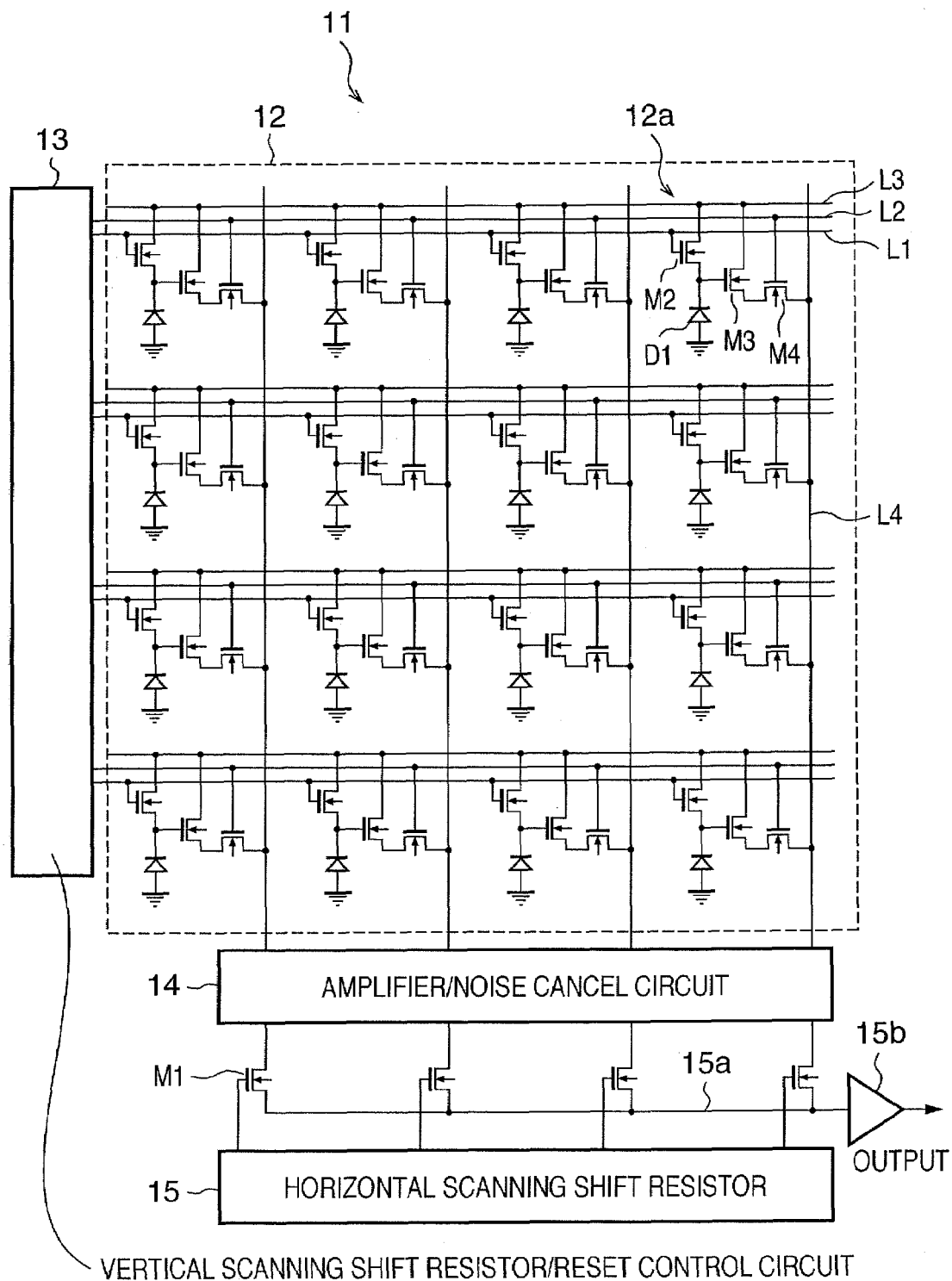
FIG. 10 is an example of a schematic layout view of a solid-state image sensor in Japanese Patent Laid-Open No. 2003-229557.
Figure 11:
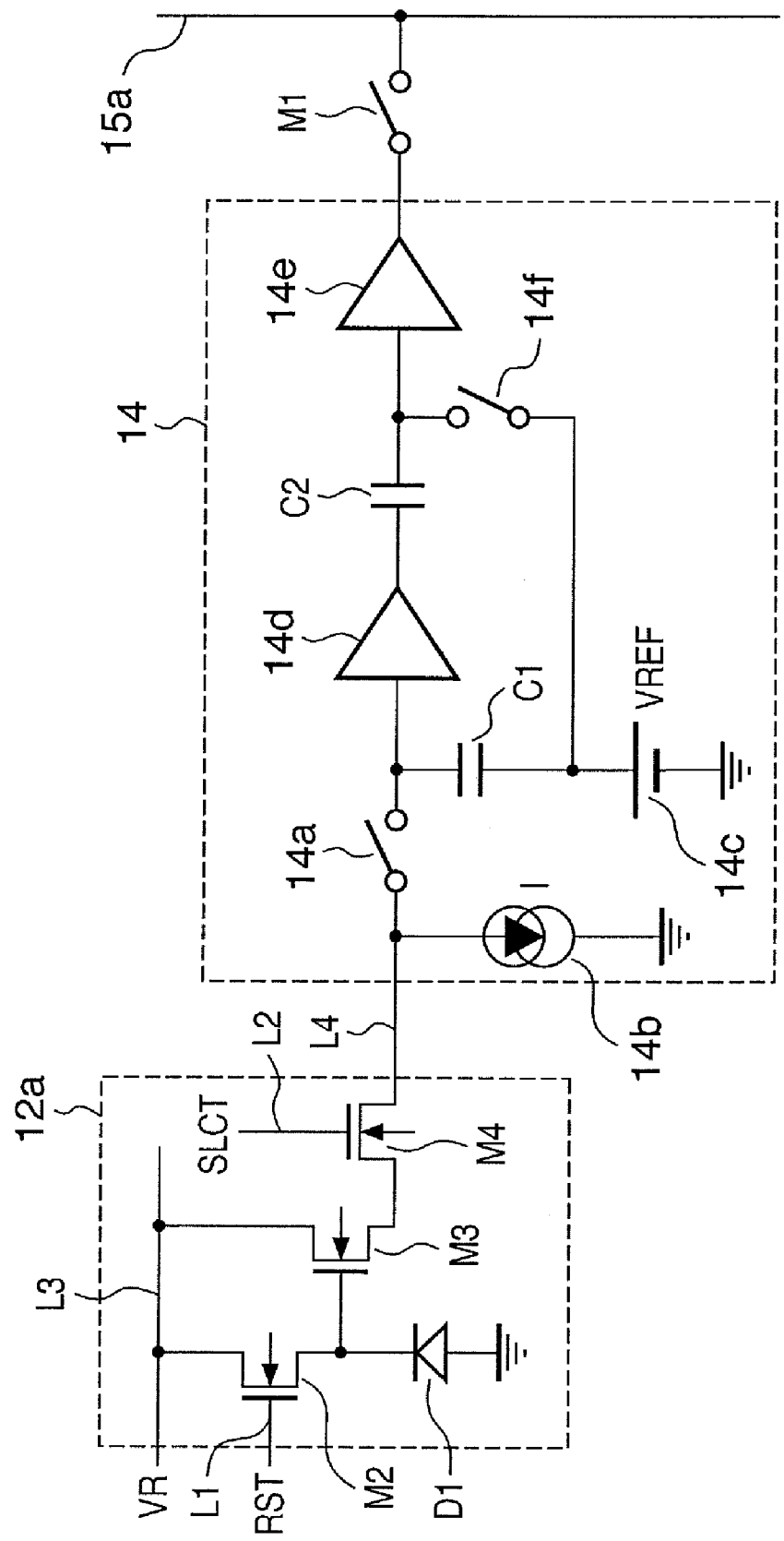
FIG. 11 is a circuit diagram showing a signal processing portion in Japanese Patent Laid-Open No. 2003-229557.

FIG. 9 is a block diagram showing the schematic arrangement of a photoelectric conversion device according to the fourth embodiment. In the fourth embodiment, a power pad 111 is formed near a vertical scanning circuit 104. Shading in the photoelectric conversion device of the fourth embodiment is larger than that in the photoelectric conversion device of the first embodiment, but the shape of the shading is moderate. This is because the resistance of the power line effectively decreases since the cross connection line serves as a shortcut to the power pad in the first embodiment.

However, when a wide second power line is ensured, the shading amount can be decreased to that in the first embodiment while keeping the moderate shape of the shading.

Fifth Embodiment

In the fifth embodiment, in addition to the arrangement of the fourth embodiment, power pad terminals are formed on the common readout circuits 105a and 105b. As a result, shading can be improved, and the OB fluctuation can be strongly suppressed. Suppressing a voltage drop across a current path through the OB is effective to suppress the OB fluctuation.

Sixth Embodiment

In the sixth embodiment, a column AD converter is formed in a signal processing portion. Since the AD converter generally consumes a large current, it is easily influenced by shading, OB fluctuation, and power fluctuation. In order to keep the performance, a power line must be improved.

Figure 14:
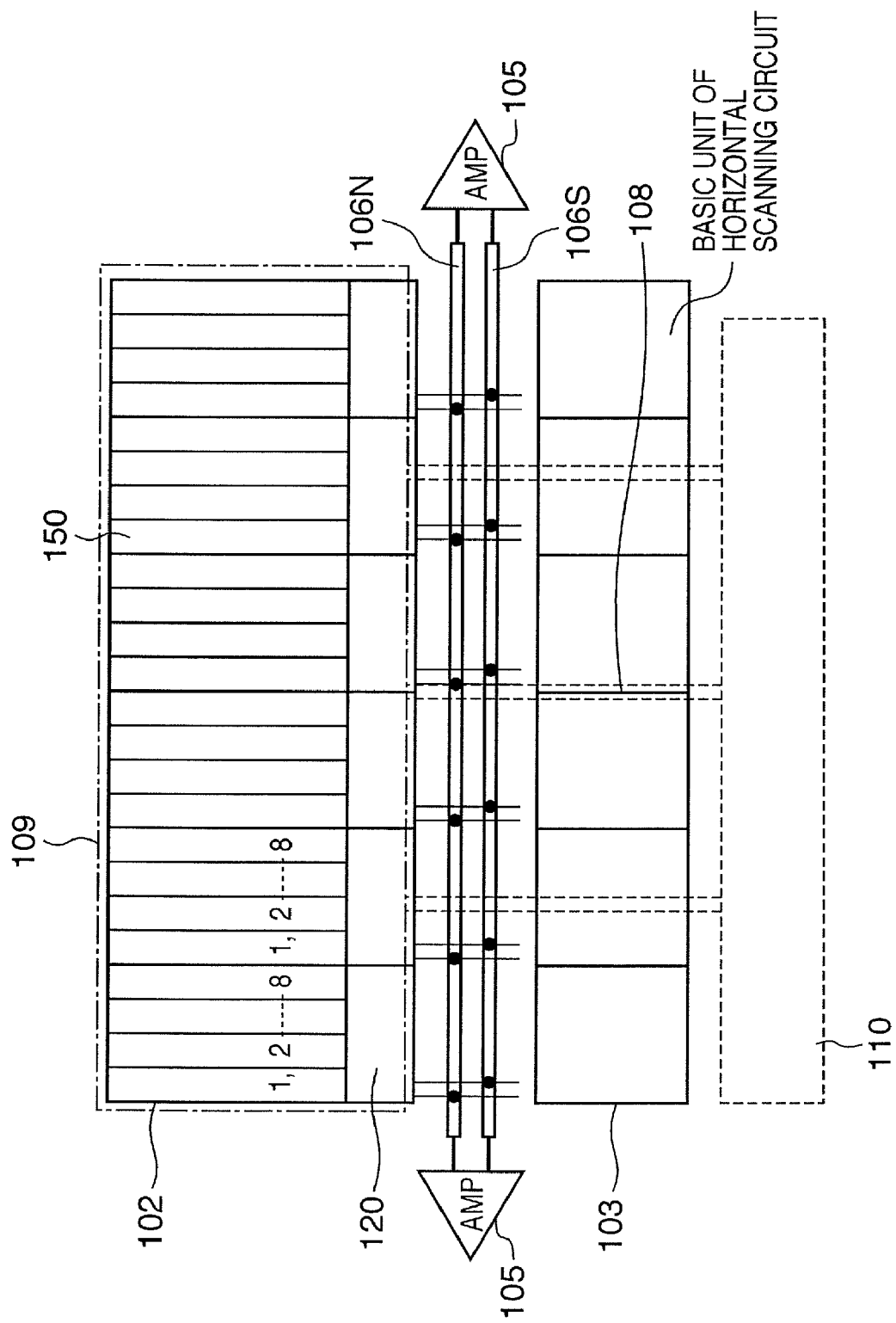
FIG. 14 is a layout view showing a preferred embodiment of the present invention.

FIG. 14 is a layout view showing the schematic arrangement of a photoelectric conversion device according to the sixth embodiment. A signal processing circuit 150 included in a signal processing portion 102 has a column AD converter. A memory portion 120 holds a signal (digital signal) output from the column AD converter. The signal held in the memory portion 120 is sequentially selected by a horizontal scanning circuit 103, and read out by a common signal line 106, i.e., 106N or 106S.

Since the common signal line 106, i.e., 106N or 106S receives a digital signal, pattern noise decreases. Hence, the degree of freedom of forming a power line wiring and a common readout circuit 105 is higher than those in the first to fifth embodiments.

In the sixth embodiment, common readout circuits 105 were formed on the left and right sides to form some cross connection lines 108 at arbitrary positions. No pattern noise was generated. In an example shown in FIG. 14, the cross connection line 108 is also formed at a breakpoint (center portion) on the readout path. The wide cross connection line 108 is easily formed at the breakpoint (center portion) on the readout path.

In an arrangement which uses the column AD converter, since a digital signal is read out to the common signal line, the degree of freedom of forming the cross connection line is high. Additionally, the readout path can easily be divided, and a wide, i.e., low-resistance cross connection pattern can be easily formed at the breakpoint on the readout path (the center portion of the readout path divided into two).

Seventh Embodiment

In an photoelectric conversion device having an arrangement exemplified in FIG. 13, a power line which applies a reference voltage VREF to the differential amplifier of an amplifier block 150A is improved. Since no current flows through this power line, no fluctuation occurs in a DC manner. However, since the fluctuation of the reference voltage of the differential amplifier is multiplied by a gain and output, the reference voltage need be stabilized.

In this embodiment, shading does not improve in a DC manner. However, a time from when a reset signal is read until an optical signal is read can be reduced to ½ or less in order to perform high-speed reading. This is because VREF fluctuation stabilizes in a short time when the resistance of a VREF power line decreases.

Eighth Embodiment

In the eighth embodiment, a single-lamp AD converter is formed in a signal processing portion to reduce the resistance of a line to which a lamp terminal is connected, according to the present invention. When a 12-bit AD converter is used, a processing time to be allocated to each bit is only several nsec. Hence, reducing the resistance of the line is effective to increase the resolution. That is, the resolution can be increased by 1 bit compared to the prior art.

As described above, in the preferred embodiments of the present invention, the cross connection line is formed, which crosses the portion of a common signal line along the signal processing portion, and connects the first and second power lines. As a result, for example, the following effects can be obtained.

(1) Horizontal shading can be reduced.

(2) The OB fluctuation can be suppressed, thereby attaining high-speed reading.

(3) The resistance of the reference power line such as a ground line can be decreased, thereby shortening a time until the fluctuation stabilizes, and attaining high-speed reading.

(4) Horizontal smear can be suppressed.

APPLICATION EXAMPLE

Figure 16:
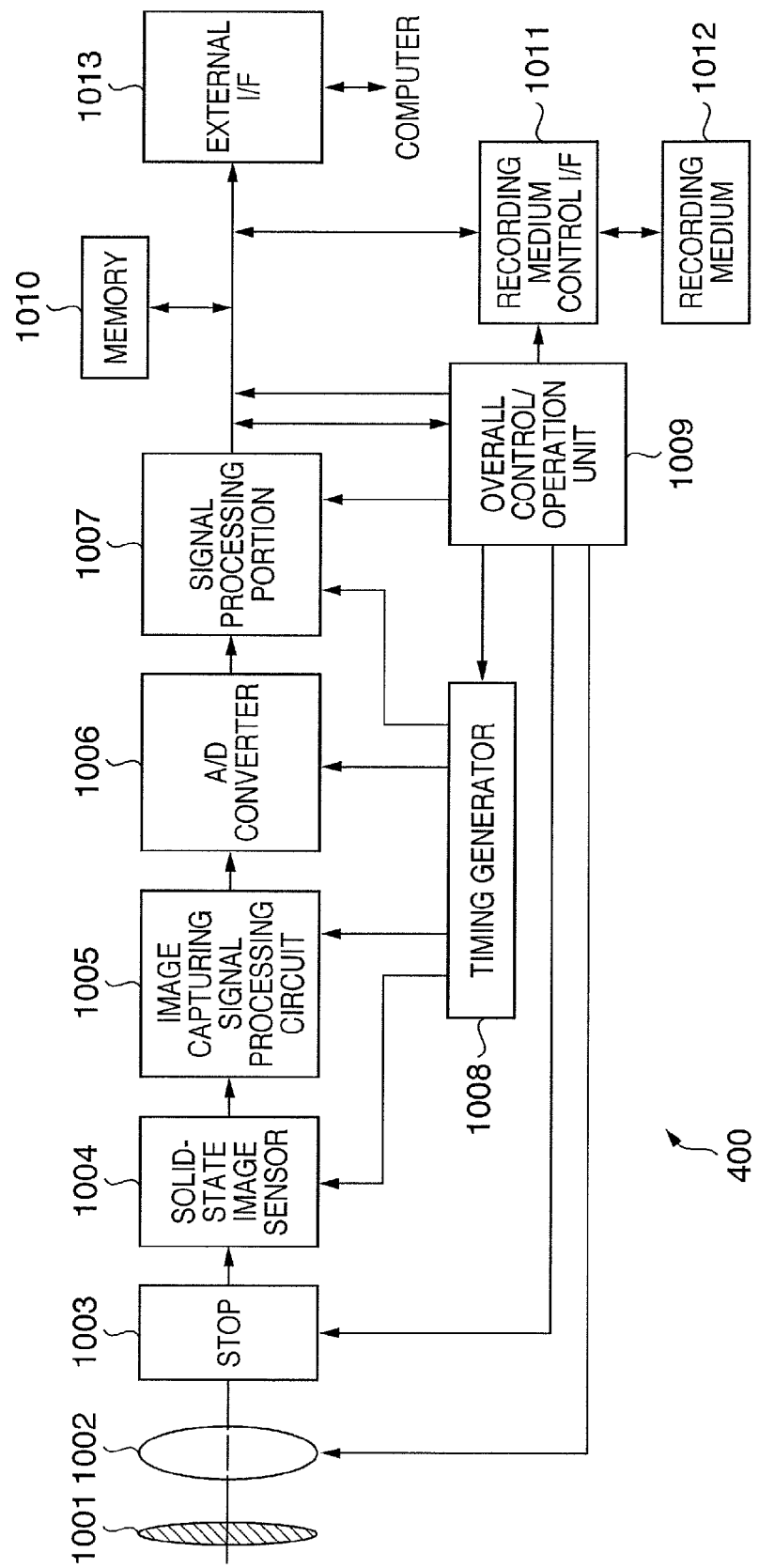
FIG. 16 is a block diagram showing the schematic arrangement of an image pickup device according to the preferred embodiment of the present invention.

FIG. 16 is a block diagram showing the schematic arrangement of an image pickup device according to a preferred embodiment of the present invention. An image pickup device 400 comprises a solid-state image sensor 1004 typified the above-described photoelectric conversion device. A lens 1002 forms an optical image of an object on the image capturing plane of the solid-state image sensor 1004. The outer surface of the lens 1002 is covered with a barrier 1001 which protects the lens 1002 and also serves as a main switch. The lens 1002 has a stop 1003 to adjust the quantity of light passing through the lens 1002. An image capturing signal processing circuit 1005 performs various processes such as correction and clamping for image capturing signals output from the solid-state image sensor 1004 through a plurality of channels. An A/D converter 1006 analog-to-digital-converts image capturing signals output from the image capturing signal processing circuit 1005 through a plurality of channels. A signal processor 1007 performs various processes such as correction and data compression for image data output from the A/D converter 1006. The solid-state image sensor 1004, image capturing signal processing circuit 1005, A/D converter 1006, and signal processor 1007 operate in accordance with timing signals generated by a timing generator 1008.

The blocks 1005 to 1008 may be formed on the same chip as that of the solid-state image sensor 1004. An overall control/operation unit 1009 controls the blocks of the image pickup device 400. The image pickup device 400 comprises a memory 1010 for temporarily storing image data, and a recording medium control interface 1011 for recording/reading out an image on/from a recording medium. A recording medium 1012 includes a semiconductor memory and the like and is detachable. The image pickup device 400 may comprise an external interface (I/F) 1013 for communicating with an external computer or the like.

The operation of the image pickup device 400 shown in FIG. 16 will be described. In response to opening of the barrier 1001, the main power supply, the power supply of the control system, and the power supply of the image capturing circuit including the A/D converter 1006 are sequentially turned on. To control the exposure, the overall control/operation unit 1009 sets the stop 1003 to the full-aperture state. A signal output from the solid-state image sensor 1004 enters the A/D converter 1006 through the image capturing signal processing circuit 1005. The A/D converter 1006 A/D-converts the signal and outputs it to the signal processor 1007. The signal processor 1007 processes the data and supplies it to the overall control/operation unit 1009. The overall control/operation unit 1009 calculates and determines the exposure. The overall control/operation unit 1009 controls the stop on the basis of the determined exposure.

The overall control/operation unit 1009 extracts a high-frequency component from the signal which is output from the solid-state image sensor 1004 and processed by the signal processor 1007, and calculates the distance to the object on the basis of the high-frequency component. The overall control/operation unit 1009 drives the lens 1002 to determine whether the object is in focus. If the overall control/operation unit 1009 determines that the object is out of focus, it drives the lens 1002 again to measure the distance.

After confirming that the object is in focus, actual exposure starts. After the end of exposure, an image capturing signal output from the solid-state image sensor 1004 undergoes correction and the like by the image capturing signal processing circuit 1005, is A/D-converted by the A/D converter 1006, and is processed by the signal processor 1007. The image data processed by the signal processor 1007 is stored in the memory 1010 by the overall control/operation unit 1009.

The image data stored in the memory 1010 is recorded on the recording medium 1012 via the recording medium control I/F under the control of the overall control/operation unit 1009. The image data can be provided to a computer or the like via the external I/F 1013 and processed by it.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-231311, filed on Aug. 28, 2006, which is hereby incorporated by reference herein in its entirety.

What is claimed is:

1. A photoelectric conversion device comprising:
a pixel array portion in which a plurality of pixels are arrayed to form a plurality of columns;
a signal processing portion which processes signals of the plurality of columns supplied from said pixel array portion;
a common readout circuit;
a common signal line which has a portion formed along said signal processing portion to transfer, to said common readout circuit, signals of said plurality of columns supplied from said signal processing portion;
a first power line formed in said signal processing portion;
a second power line formed on an opposite side to said first power line when viewed from said common signal line; and
a cross connection line which crosses the portion of said common signal line along said signal processing portion, and connects said first power line and said second power line.

2. The device according to claim 1, further comprising a bypass connection line which connects said first power line and said second power line outside said signal processing portion.

3. The device according to claim 1, further comprising a horizontal scanning circuit which sequentially selects said plurality of columns in said signal processing portion, wherein said common signal line includes a portion which passes between said signal processing portion and said horizontal scanning circuit.

4. The device according to claim 3, wherein a part of said second power line is formed in an area of said horizontal scanning circuit.

5. The device according to claim 1, wherein said plurality of cross connection lines are formed in a cycle in accordance with a repeating cycle of a connection portion between said signal processing portion and said common signal line.

6. The device according to claim 1, wherein said common signal line includes an N signal line which transfers a noise level and an S signal line which transfers an optical signal level, an N signal lead line is formed between said signal processing portion and said N signal line, an S signal lead line is formed between said signal processing portion and said S signal line, and
said cross connection line is formed between said N signal lead line and said S signal lead line.

7. An image pickup device comprising:
a photoelectric conversion device defined in claim 1; and
a signal processor which processes a signal supplied from said photoelectric conversion device.

* * * * *